United States Patent [19]

Iwata et al.

[11] Patent Number: 5,665,250

[45] Date of Patent: Sep. 9, 1997

[54] METHOD OF MANUFACTURING SURFACE TYPE ACCELERATION SENSOR METHOD OF MANUFACTURING

[75] Inventors: Hitoshi Iwata; Makoto Murate, both of Aichi, Japan

[73] Assignee: Kabushiki Kaisha Tokai Rika Denki Seisakusho, Aichi, Japan

[21] Appl. No.: 622,877

[22] Filed: Mar. 29, 1996

Related U.S. Application Data

[62] Division of Ser. No. 538,697, Oct. 3, 1995.

[30] Foreign Application Priority Data

Oct. 6, 1994 [JP] Japan ..................... 6-243127

[51] Int. Cl.$^6$ ................................. H01L 21/00
[52] U.S. Cl. ................... 438/52; 216/62; 216/87; 216/2; 438/960
[58] Field of Search ............... 156/647.1, 657.1, 156/659.11, 662.1; 216/2, 41, 62, 87; 437/228, 901, 927; 148/DIG. 73; 73/514.16

[56] References Cited

U.S. PATENT DOCUMENTS 5,232,866  8/1993  Beyer et al. ..................... 437/927
5,242,863  9/1993  Xiang-Zheng et al. .............. 437/901

FOREIGN PATENT DOCUMENTS 4-71344  10/1983  Japan.

*Primary Examiner*—William Powell
*Attorney, Agent, or Firm*—Finnegan, Henderson, Farabow, Garrett & Dunner, L.L.P.

[57] ABSTRACT

A surface type acceleration sensor includes a p-type single crystal silicon base plate, a cantilever functioning as a cantilever structure portion, and a plurality of strain gauges. The cantilever is disposed in a recess portion formed on the front face of the p-type single crystal silicon base plate so that the cantilever can be displaced in the upward and downward direction. The cantilever includes an epitaxial growth layer principally made of n-type single crystal silicon. The strain gauge is made of p-type silicon and formed on an upper face of the base end portion of the cantilever.

2 Claims, 9 Drawing Sheets

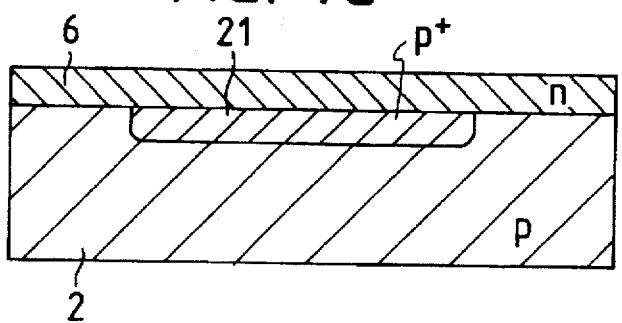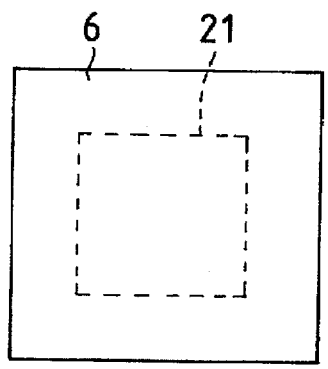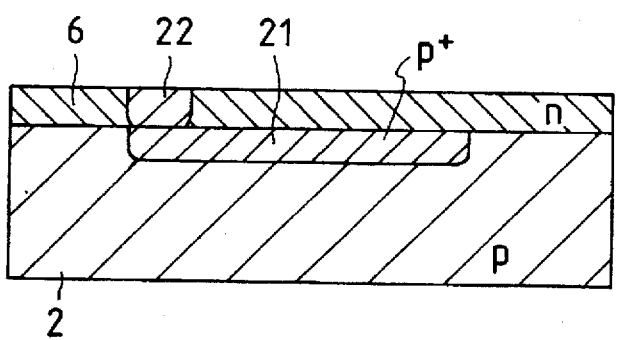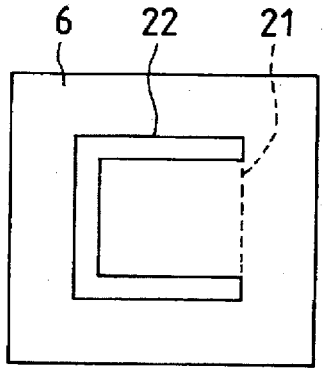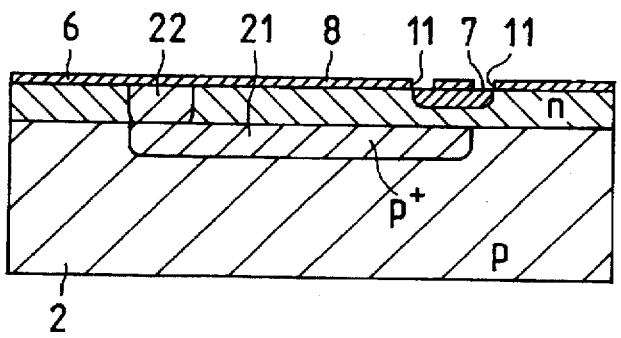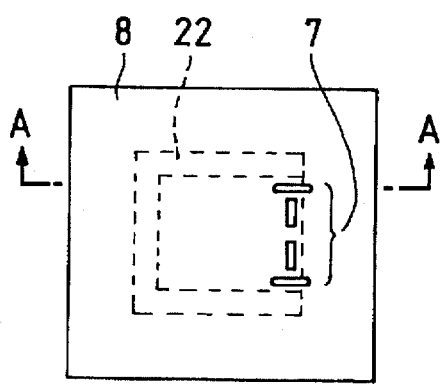

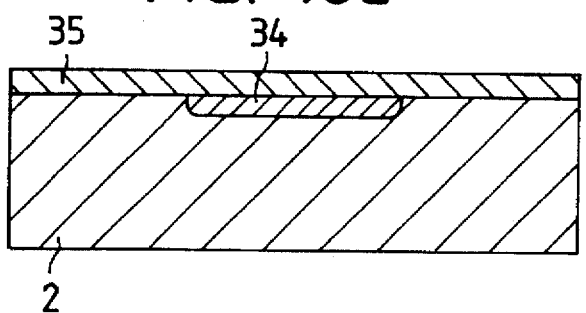
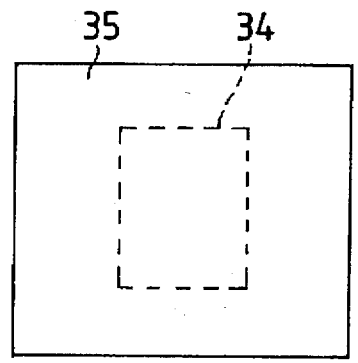
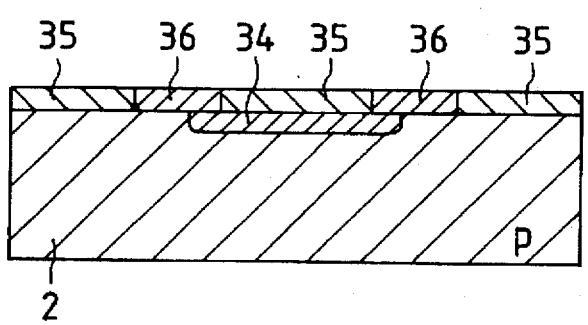
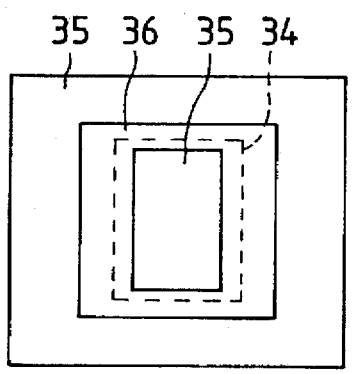
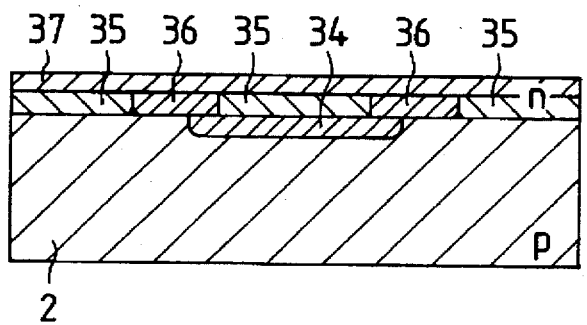
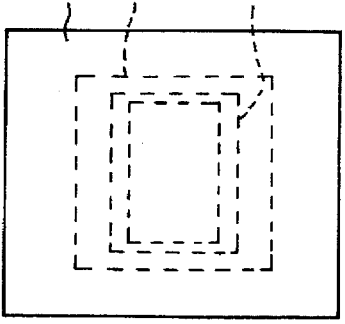

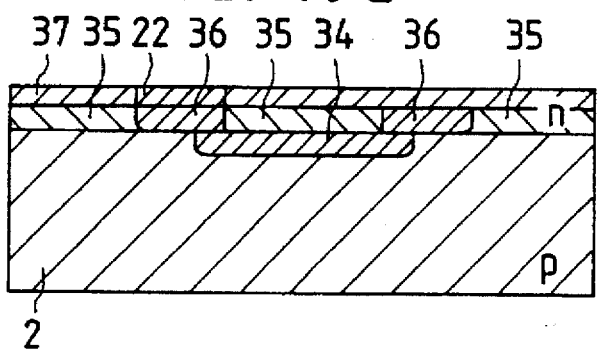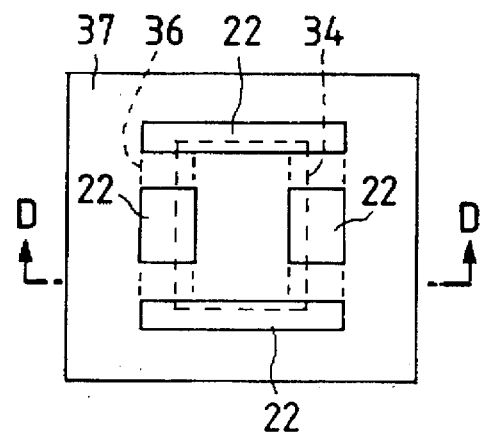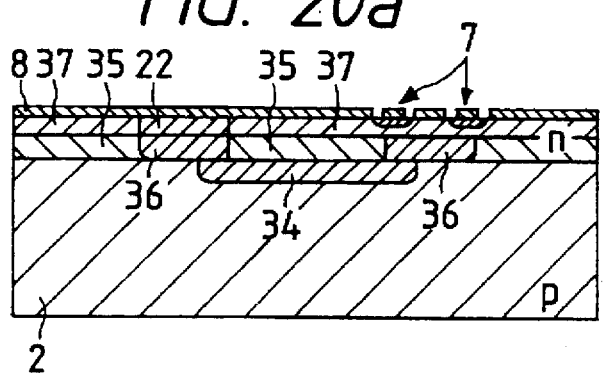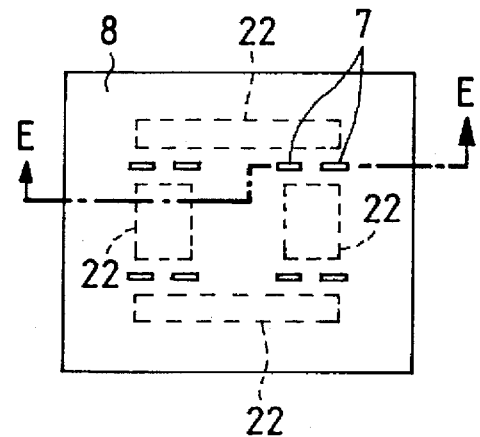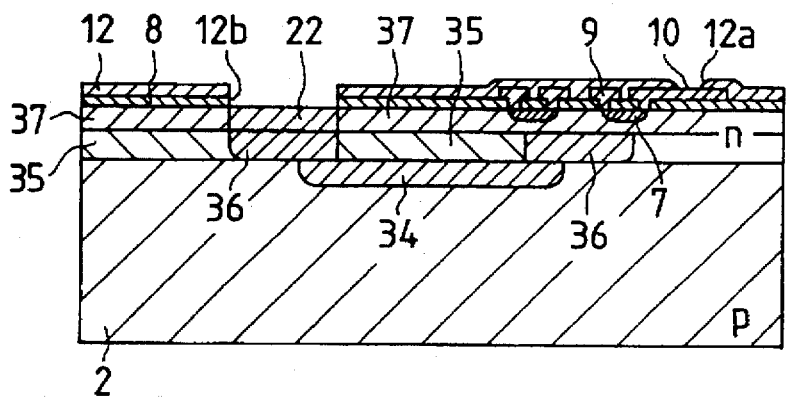

METHOD OF MANUFACTURING SURFACE TYPE ACCELERATION SENSOR METHOD OF MANUFACTURING

This application is a division of application Ser. No. 08/538,697, filed Oct. 3, 1995.

BACKGROUND OF THE INVENTION

1. Field of the Invention

This invention relates to a surface type acceleration sensor and a manufacturing method thereof which is manufactured when a thin film formed on the surface of a silicon base plate is subjected to etching.

2. Background

A Strain gauge type acceleration sensor 40 of the bulk type shown in FIG. 23 is well known as an acceleration sensor used for ABS (the anti-lock brake system), the air bag system or the suspension control system of an automobile.

This type acceleration sensor 40 is manufactured in such a manner that a bulk of the single crystal base plate 41 made of silicon, the shape of which is rectangular parallelepipedic the crystal plane index of which is (100), is selectively etched from the front and reverse sides, that is, a bulk of the single crystal base plate 41 is subjected to crystal anisotropy etching. A cantilever structure portion 42 formed by etching includes a cantilever 43 and a mass portion 44. The mass portion 44 functions as a weight and is disposed at an end of the cantilever 43. A plurality of strain gauges 45 are provided onto an upper face of the cantilever 43. When an acceleration is impressed upon this acceleration sensor 40, the mass portion 44 is displaced in a predetermined direction, so that the cantilever 43 is bent. At this time, strain is induced in the strain gauges 45 provided on the upper face of the cantilever 43. As a result, by the piezo-resistance effect of silicon, resistance values of the strain gauges 45 are increased or decreased. When the changes in these resistance values are detected, the acceleration can be found.

In this connection, in order to obtain a predetermined detection sensitivity by the conventional acceleration sensor 40, it is necessary to use a single crystal base plate 41 made of silicon, the thickness of which is at least 200 to 300 μm so that a thick mass portion 44 can be formed.

However, when the thick single crystal base plate 41 of silicon is etched from the reverse side, consideration must be given to the anisotropic etching characteristic, that is, consideration must be given to that an etching hole, the opening angle of which is θ=125.26°, is formed along the plane of (111). Therefore, it is necessary to set the size of an opening portion "a" at a fairly high value. Due to the foregoing, width W of the chip is increased. Therefore, it is difficult to sufficiently reduced the dimensions of the overall acceleration sensor 40.

As shown in FIG. 24, the bulk type acceleration sensor 40 is commonly joined onto another base plate 47 via a die bonding agent 46 coated on the reverse side of the single crystal base plate 41 of silicon. In this case, it is necessary to avoid the deposition of the die bonding agent 46 onto the mass portion 44, and it is also necessary to avoid the contact of the mass portion 44 with the base plate 47 so that the mass portion 44 can be freely displaced. However, in order to accomplished the above object, it is necessary to arrange a mount 48 on the reverse side of the single crystal base plate 41 of silicon. Therefore, the packaging work of the acceleration sensor 40 becomes complicated.

As a different type sensor from the above bulk type acceleration sensor 40, there is provided a surface type acceleration sensor which is manufactured when a thin film formed on the front side of a silicon base plate is etched. For example, Japanese Examined Patent Publication No. 4-71344 discloses a method of manufacturing the above type acceleration sensor by "anode formation". The summary of the method will be briefly described as follows.

First, a portion of the p-type single crystal silicon base plate is subjected to anode formation so as to form a porous silicon layer. Then, a p-type single crystal silicon layer is epitaxially grown on the surface. Next, a portion of the epitaxial growth layer is removed, and a porous silicon layer exposed from the removal portion is oxidized. Then, an N-type diffusion strain gauge is provided at a predetermined position on an upper face of the epitaxial growth layer. Then the oxidized porous silicon layer is etched by hydrofluoric acid, so that a cavity is formed in a lower portion of the epitaxial growth layer. Finally, an electrode is formed in the diffusion strain gauge. In this way, manufacture of the surface type acceleration sensor is completed.

However, the following problems (1) to (4) may be encountered in the above manufacturing method.

(1) According to the above method, a mask of $Si_3N_4$ is disposed on the p-type single crystal silicon base plate, and the opening portion is subjected to anode formation. Accordingly, the dimensions of the anode formation portion tend to fluctuate. Therefore, it is necessary to severely set the processing temperature and the processing time.

(2) It is very difficult to form an epitaxial growth layer on the porous silicon layer.

(3) Since the epitaxial growth layer is of the p-type, it is necessary to Use a diffusion strain gauge of the n-type. Compared with a case in which the p-type diffusion strain gauge is used, the gauge factor is reduced in this case. Therefore, it is impossible to obtain a predetermined detection sensitivity.

(4) after the anode formation portion has been etched, a wiring pattern is formed. Therefore, the resist enters a cavity in the process of photolithography. For this reason, it is necessary to remove the resist that has entered.

In the case of the acceleration sensor described in Japanese Examined Patent Publication No. 4-71344, it is difficult to form a large mass portion. Difficulty of forming a large mass portion is not limited to the above case. In general, forming a large mass portion is difficult in the care of a surface type acceleration sensor. Therefore, advent of a surface type acceleration sensor having the same detection sensitivity as that of the bulk type acceleration sensor has long been desired.

SUMMARY OF THE INVENTION

The present invention has been accomplished to solve the above problems. It is an object of the present invention to provide a surface type acceleration sensor characterized in that: the dimensions are reduced; the sensitivity is high; and the packaging work is easy.

It is another object of the present invention to provide a method of manufacturing the surface type acceleration sensor characterized in that: the manufacturing process can be simplified and the manufacturing work can be easily carried out.

In order to solve the above problems, according to a first aspect of the present invention, there is provided a surface type acceleration sensor which comprising: a p-type single crystal silicon base plate, on the front face of which a recess is formed; a cantilever structure portion including an epitaxial growth layer made of n-type single crystal silicon, the cantilever structure portion capable of being displaced in the recess; and a strain gauge made of p-type silicon attached onto an upper face of the cantilever structure portion.

Further, according to the first aspect of the present invention, the cantilever structure portion includes a beam, onto the upper face of which the strain gauge is attached, and a mass portion supported by the beam.

Further, according to the first aspect of the present invention, the crystal plane index of the p-type single crystal silicon base plate is {110}, and the longitudinal direction of the strain gauge is approximately parallel to the direction of <111>.

Furthermore, in order to solve the above problems, according to a second aspect of the present invention, there is provided a method of manufacturing a surface type acceleration sensor comprising the steps of: forming a p-type silicon layer in a predetermined region on the front face side of the p-type single crystal silicon base plate by adding impurities; embedding the p-type silicon layer in an epitaxial growth layer when the epitaxial growth layer made of n-type single crystal silicon is formed on an upper face of the p-type single crystal silicon base plate; forming a p-type silicon layer for the formation of an opening portion on the epitaxial growth layer by adding impurities; forming a strain gauge made of p-type silicon on an upper face of the epitaxial growth layer; forming a passivation film for covering a wiring pattern after the formation of the wiring pattern connected to the strain gauge; changing each p-type silicon layer into a porous silicon layer when anode formation processing is conducted under the condition that an etching resist is formed on an upper face of the passivation film; and forming a cavity in a portion where the porous silicon layer was located when the porous silicon layer is removed by alkali etching.

Furthermore, in order to solve the above problems, according to a third aspect of the present invention, there is provided a method of manufacturing a surface type acceleration sensor comprising the steps of: forming a first p-type silicon layer in a predetermined region on the front face side of the p-type single crystal silicon base plate by adding impurities; embedding the first p-type silicon layer in a first epitaxial growth layer when the first epitaxial growth layer made of n-type single crystal silicon is formed on an upper face of the p-type single crystal silicon base plate; forming a second p-type silicon layer in a predetermined region on the first epitaxial growth layer by adding impurities; embedding the second p-type silicon layer in a second epitaxial growth layer when the second epitaxial growth layer made of n-type single crystal silicon is formed on an upper face of the first epitaxial growth layer; forming partially a p-type silicon layer for the formation of an opening portion on an upper face of the embedded second p-type silicon layer when impurities are added; forming a strain gauge made of p-type silicon on an upper face of the epitaxial growth layer; forming a passivation film for covering a wiring pattern after the formation of the wiring pattern connected to the strain gauge; changing each p-type silicon layer into a porous silicon layer when anode formation processing is conducted under the condition that an etching resist is formed on an upper face of the passivation film; and forming a cavity in a portion where the porous silicon layer was located when the porous silicon layer is removed by alkali etching.

According to the invention, the cantilever structure portion includes the epitaxial growth layer of n-type single crystal silicon. Accordingly, it is possible to provide a strain gauge of p-type silicon having a high gauge factor on the epitaxial growth layer of n-type single crystal silicon. Since this acceleration sensor is of the surface type, it is possible to manufacture it without conducting anisotropic etching from the reverse side of the p-type single crystal silicon layer.

According to the invention after a p-type silicon layer has been previously formed in a predetermined region, the p-type silicon layer is subjected to anode formation. Due to the foregoing, a porous silicon layer is formed in a predetermined region. When this porous silicon layer is subjected to alkali etching, only the porous silicon layer is selectively etched, so that a cavity portion and a cantilever structure portion can be formed in the epitaxial growth layer. Especially in the case of the invention described in FIG. 5, the epitaxial growth layer is 2 layers. Accordingly, it is possible to form a more complicated cantilever structure portion.

BRIEF DESCRIPTION OF THE DRAWINGS

FIG. 7a is a cross-sectional view showing an outline of the manufacturing procedure of the acceleration sensor;

FIG. 7b is a plan view showing an outline of the manufacturing procedure of the acceleration sensor;

FIG. 8a is a cross-sectional view showing an outline of the manufacturing procedure of the acceleration sensor;

FIG. 8b is a plan view showing an outline of the manufacturing procedure of the acceleration sensor;

FIG. 9a is a cross-sectional view showing an outline of the manufacturing procedure of the acceleration sensor taken on line A—A in FIG. 9b;

FIG. 9b is a plan view showing an outline of the manufacturing procedure of the acceleration sensor;

FIG. 12b is a cross-sectional view showing an outline of the acceleration sensor of the second embodiment taken on line C—C in FIG. 12a;

FIG. 16a is a cross-sectional view showing an outline of the acceleration sensor of the second embodiment;

FIG. 16b is a plan view showing an outline of the acceleration sensor of the second embodiment;

FIG. 17a is a cross-sectional view showing an Outline Of the acceleration sensor of the second embodiment;

FIG. 17b is a plan view showing an outline of the acceleration sensor of the second embodiment;

FIG. 18a is a cross-sectional view showing an outline of the acceleration sensor of the second embodiment;

FIG. 18b is a plan view showing an outline of the acceleration sensor of the second embodiment;

FIG. 19a is a cross-sectional view showing an outline of the acceleration sensor of the second embodiment taken on line D—D in FIG. 19b;

FIG. 19b is a plan view of showing an outline of the acceleration sensor of the second embodiment;

FIG. 20a is a cross-sectional view showing an outline of the acceleration sensor of the second embodiment taken on line E—E in FIG. 20b;

FIG. 20b is a plan view of showing in outline of the acceleration sensor of the second embodiment;

FIG. 21 is a cross-sectional view showing an outline of the acceleration sensor of the second embodiment;

DETAILED DESCRIPTION OF THE PREFERRED EMBODIMENTS

First Embodiment

With reference to FIGS. 1 to 11, the first embodiment of the present invention will be explained in detail as follows.

Figure 1:
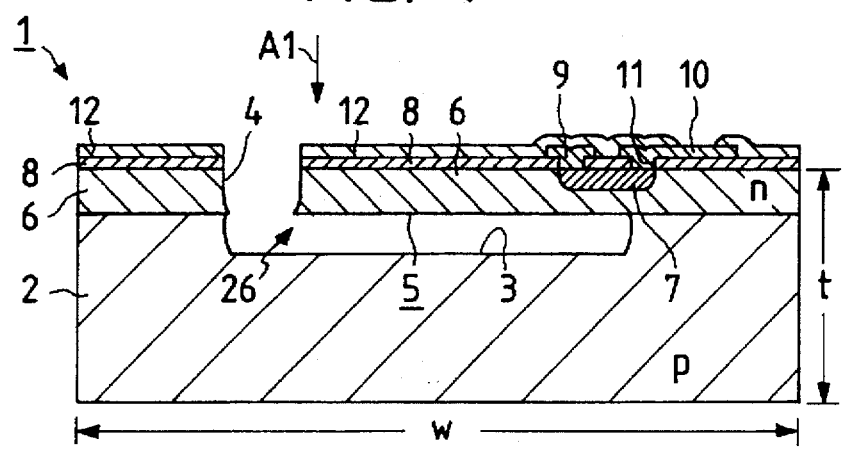
FIG. 1 is a cross-sectional view showing an outline of the surface type acceleration sensor of the first embodiment.
Figure 2:
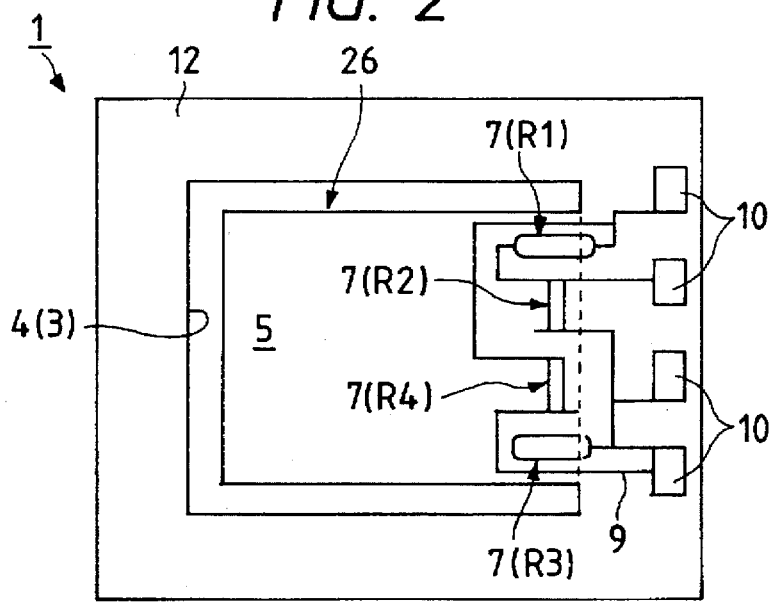
FIG. 2 is a plan view showing an outline of the surface type acceleration sensor of the first embodiment.

In FIGS. 1 and 2, the surface type acceleration sensor 1 of this embodiment is schematically shown. Reference numeral 2 is a p-type single crystal base plate made of silicon, the crystal plane index of which is (110), which will be referred to as a silicon base plate in this specification, hereinafter. At the center on the front face of the silicon base plate 2, there is provided an approximately square recess portion 3 obtained when a porous layer made of p-type silicon is subjected to alkali etching. This recess portion 3 is provided with an approximately C-shaped opening 4. In this recess portion 3, a cantilever 5, which includes a cantilever structure portion, is arranged in such a manner that the cantilever 5 can be displaced in the upward and downward direction. This cantilever 5 principally includes an epitaxial growth layer 6 made of n-type single crystal silicon. At the base end on an upper face of the cantilever 5, there are provided 4 diffusion strain gauges 7 which are made of p-type silicon by adding impurities.

On an upper face of the epitaxial growth layer 6, there is provided a thin oxide film (film made of $SiO_2$) 8 which functions as an insulating layer. On an upper face of this oxide film 8, there are provided a wiring pattern 9 and a bonding pad 10 which are formed by a physical film forming method such as spattering or vapor deposition. In a predetermined portion on the oxide film 8, that is, in both end portions on the upside of the diffusion strain gauge 7, there are provided contact holes 11 for connecting layers. The contact holes 11 electrically connect the wiring patterns 9 with the diffusion strain gauges 7 arranged on the lower layer. These wiring patterns 9 are respectively connected with the bonding pads 10 arranged on the upper face in the outer periphery of the silicon base plate 2. On the Upper face of the oxide film 8, there is provided a thin passivation film 12 for insulation, which is formed by the aforementioned physical film forming method. The bonding pad 10 is exposed from an opening formed at a predetermined position on the passivation film 12.

Figure 3:
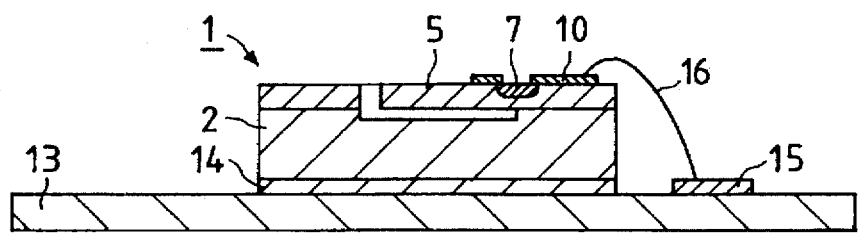
FIG. 3 is a cross-sectional view showing an outline of the condition in which the acceleration sensor is packaged.

In FIG. 3, there is shown a condition in which the acceleration sensor 1 is packaged onto another base plate (mother board) 13. That is, a reverse side of the silicon base plate 2 is entirely coated with a die bonding agent 14. The silicon base plate 2 is joined onto the mother board 13 by the die bonding agent 14. The bonding pad 10 on the silicon base plate 2 side and the bonding pad 15 on the mother board 13 side are electrically connected with each other through the wire bonding 16. In this connection, on the mother board 13, there is provided a signal processing circuit for finding an acceleration according to the output voltage of the acceleration sensor 1.

In this embodiment, dimensions of each portion are described as follows. Width W and thickness t of the silicon base plate 2 including the epitaxial growth layer 6 are approximately 500 μm and 500 to 1000 μm. Thickness, width and length of the cantilever 5 are approximately 10 μm, 200 μm and 300 μm. A clearance between the bottom face of the cantilever and the inner bottom face of the recess portion 3 is approximately 10 μm. Thickness of the oxide film 8 is approximately 1 μm, and thickness of the passivation film 12 is approximately 1 μm.

Figure 4:
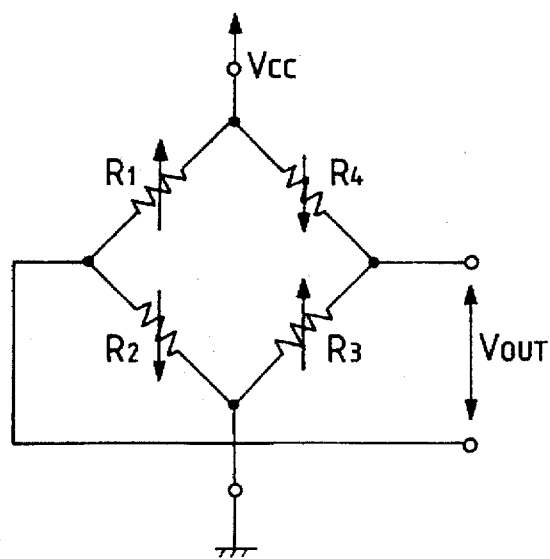
FIG. 4 is an equivalent circuit diagram of the acceleration sensor.

FIG. 4 shows an equivalent circuit of the diffusion strain gauge 7 including diffusion strain resistances R1 to R4. A node formed between the diffusion strain resistances R1 and R4 is connected with the bonding pad 10 for supplying electric power source voltage $V_{CC}$. On the other hand, a node formed between the diffusion strain resistances R2 and R3 is connected with the bonding pad 10 used for ground. A node formed between the diffusion strain resistances R3 and R4 is connected with one of the two bonding pads 10 used for outputting. A node formed between the diffusion strain resistances R1 and R2 is connected with the other of the two bonding pads 10 used for outputting. In this connection, the layout of the diffusion strain resistances R1 to R4 provided on the cantilever 5 is schematically illustrated in FIG. 2. As shown in the drawing, the diffusion strain resistances R1 to R4 are substantially aligned on a straight line in the order of R1, R2, R3 and R4. The longitudinal directions of R1 and R3 are parallel to the extending direction of the cantilever 5. On the other hand, the longitudinal directions of R2 and R4 are perpendicular to the extending direction of the cantilever 5. Accordingly, the former R1 and R3 extend in the direction of [110], and the latter R2 and R4 extend in the direction of [1 bar, 1 bar, 0].

When an acceleration is impressed upon this acceleration sensor 1 in the direction of arrow A1 in FIG. 1, the entire cantilever 5 is displaced downward, so that the base end portion of the cantilever 5 is bent. At this timer strain is induced in the diffusion strain gauges 7 including diffusion strain resistances R1 to R4. As a result, due to the piezo-resistance effect of silicon, the resistance value of each diffusion strain gauge 7 is increased or decreased. When a change in this resistance value is detected, the acceleration can be detected.

Next, the manufacturing procedure of the acceleration sensor 1 of this embodiment will be explained with reference to FIGS. 5 to 11.

Figure 5A:
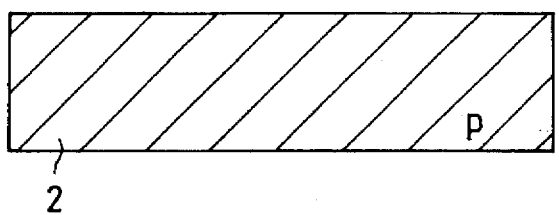
FIG. 5a is a cross-sectional view showing an outline of the manufacturing procedure of the acceleration sensor.
Figure 5B:
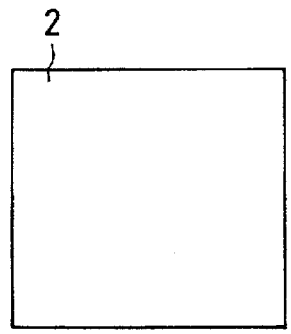
FIG. 5b is a plan view showing an outline of the manufacturing procedure of the acceleration sensor.
Figure 6A:
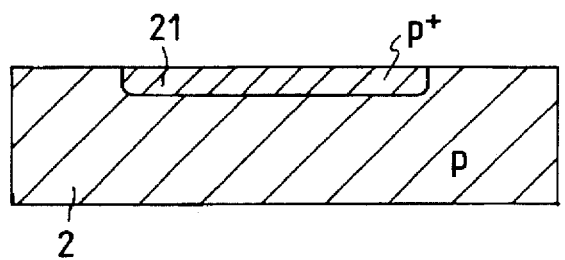
FIG. 6a is a cross-sectional view showing an outline of the manufacturing procedure of the acceleration sensor.
Figure 6B:
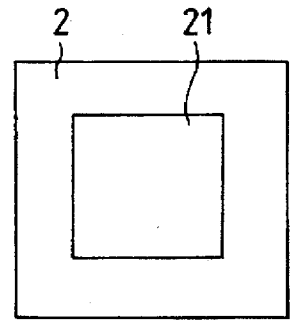
FIG. 6b is a plan view showing an outline of the manufacturing procedure of the acceleration sensor.

First, as illustrated in FIG. 5, a p-type single crystal silicon base plate 2 is prepared, the shape of which is rectangular parallelepipedic, and the crystal plane index of which is (110). A mask not shown in the drawing is formed on the surface of the silicon base plate 2. Then, boron is driven onto the silicon base plate 2 by means of ion injection. Further, the driven boron is thermally diffused. As a result, as illustrated in FIG. 6, a p-type silicon layer 21 is formed approximately at the center of the silicon base plate 2.

Next, as illustrated in FIG. 7, an epitaxial growth layer 6 made of n-type single crystal silicon is formed on an upper face of the silicon base plate 2, on which the p-type silicon layer 21 is formed, by means of gaseous phase growth. As a result, the p-type silicon layer 21 is embedded in the epitaxial growth layer 6. After that, a mask not shown is formed on the surface of the silicon base plate 2 on which the epitaxial growth layer 6 has been formed. An approximately C-shaped opening is formed in a predetermined region of the mask by means of photo-etching.

Next, boron is driven onto the silicon base plate 2 by means of ion injection, and further the driven boron is thermally diffused. As a result, as illustrated in FIG. 8, an approximately C-shaped p-type silicon layer 22 for the formation of an opening is formed on the epitaxial growth layer 6. Depth of this p-type silicon layer 22 reaches the embedded p-type silicon layer 21.

Next, a mask hot shown is arranged on an upper face of the epitaxial growth layer 6 on the silicon base plate 2. Next, boron is driven onto the silicon base plate 2 by means of ion injection, and further the driven boron is thermally diffused. As a result, 4 diffusion strain gauges 7 are formed in a portion which will become an upper face of the base end portion of the cantilever 5 later. Next, the silicon base plate 2 is heated in oxygen or air, so that an oxide film 8 is formed on the upper face of the silicon base plate 2. Next, as illustrated in FIG. 9, a contact hole 11 is formed in a predetermined portion on the oxide film 8 by means of photo-etching.

Figure 10A:
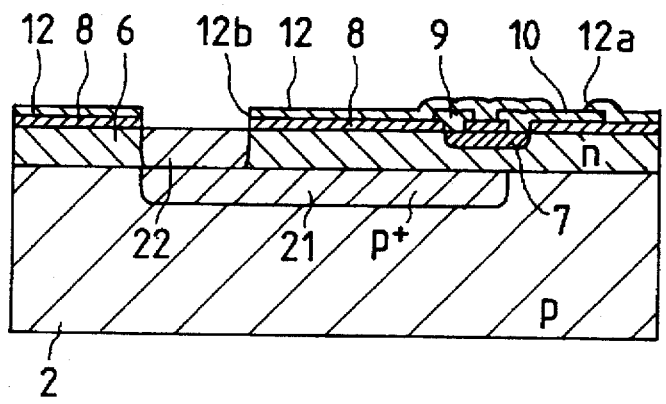
FIG. 10a is a cross-sectional view showing an outline of the manufacturing procedure of the acceleration sensor taken on line B—B in FIG. 10b.
Figure 10B:
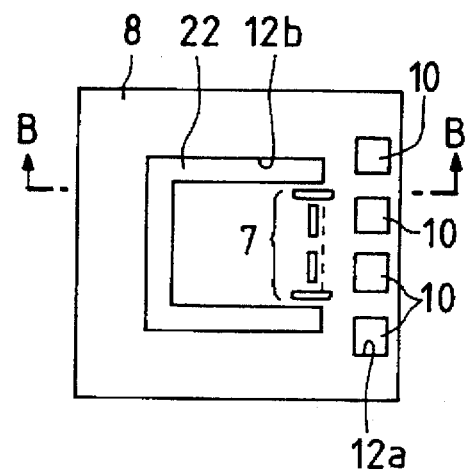
FIG. 10b is a plan view showing an outline of the manufacturing procedure of the acceleration sensor.
Figure 11:
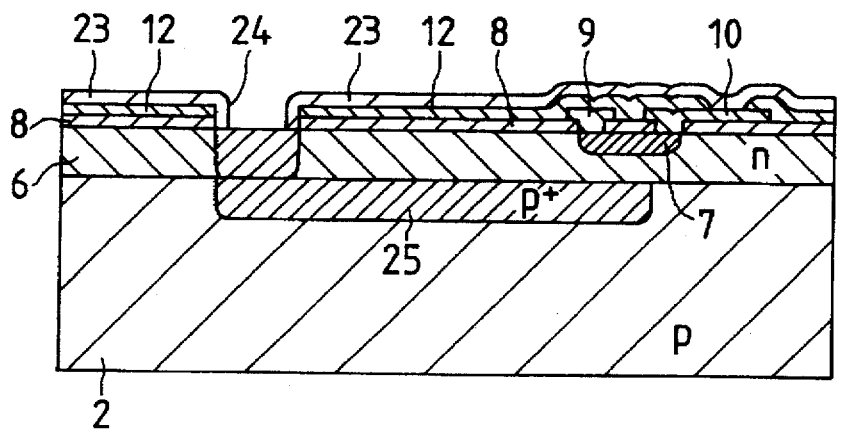
FIG. 11 is a cross-sectional view showing an outline of the manufacturing procedure of the acceleration sensor.

Next, after spattering or vapor-deposition of Al has been conducted on the silicon base plate 2, photolithography is conducted so that the wiring pattern 9 and the bonding pad 10 are formed. Next, when SiN and $Si_3N_4$ are accumulated by CVD etc., a passivation film 12 covering the wiring pattern 9 is formed on the upper face of the silicon base plate 2 as illustrated in FIG. 10. In the process of passivation, an opening 12a for exposing the bonding pad 10 and an approximately C-shaped opening 12b are formed on the passivation film 12. After that, when the oxide film 8 on the upper face of the p-type silicon layer 22 is removed, the upper face of the p-type silicon layer 22 is exposed.

Next, the entire upper face of the passivation film 12 is covered with the etching resist 23. After that, an approximately C-shaped opening 24 is formed in a portion corresponding to the upper face of the p-type silicon layer 22 by photolithography. Then the silicon base plate 2 is dipped in an aqueous solution of hydrofluoric acid of high concentration. Under this condition, an electric current is caused to flow, wherein the silicon base plate 2 is used as an anode. Due to the anode formation described above, only the portions 21 and 22 on the p-type silicon layer are selectively made to be porous, so that the portions are changed into a porous silicon layer 25.

Then the silicon layer is subjected to alkali etching by TMAH (tetramethylammoniumhydroxide). In this way, the porous silicon layer 25 is subjected to anisotropic etching. When the p-type silicon layers 21, 22 are made to be porous by anode formation, they are easily dissolved in alkali. As a result, a cavity is easily formed in the portion where the porous silicon layer 25 was disposed. Finally, the unnecessary etching resist 23 is removed. In this way, the acceleration sensor 1 illustrated in FIG. 1 can be provided.

In this connection, in the case of the acceleration sensor 1 of this embodiment, the cantilever 5, which is the cantilever structure portion, is principally including the epitaxial growth layer 6 made of n-type single crystal silicon. For this reason, it is possible to form a diffusion strain gauge 7 made of p-type silicon, the gauge factor of which is high. Accordingly, compared with the conventional acceleration sensor provided with a diffusion strain gauge made of n-type silicon, the sensitivity of the acceleration sensor of this embodiment can be enhanced. Since the acceleration sensor 1 is of the surface type, it is possible to manufacture the acceleration sensor 1 without conducting anisotropic etching from the reverse side of the silicon base plate 2. Accordingly, problems peculiar to the conventional bulk type acceleration sensor can be solved by the structure of this embodiment, that is, the problem of an increase in the chip width W caused in accordance with the formation of an etching hole along the face (111) can be solved. Consequently, it is possible to downsize the overall acceleration sensor 1 while the detection sensitivity of the sensor is maintained at a predetermined level. In addition to that, in the case of the surface type acceleration sensor 1, the cantilever 5 is not exposed from the bottom face of the silicon base plate 2. Accordingly, the die bonding agent 14 is not deposited on the cantilever 5, and further the cantilever 5 is not contacted with the mother board 13. Therefore, it is not necessary to arrange a mount, so that the packaging work of the acceleration sensor 1 becomes easy.

According to the manufacturing method of this embodiment, the following mode of operation can be provided.

First, according to the manufacturing method of this embodiment, after the p-type silicon layers 21, 22 have been previously formed in a predetermined region, the layers are subjected to anode formation. Therefore, compared with the conventional method in which the surface of the silicon base plate 2 is directly subjected to anode formation, the method of this embodiment is advantageous in that the shape and depth of the anode formation portion are difficult to fluctuate. Secondly, according to the method of this embodiment, the epitaxial growth layer 6 is formed on the p-type silicon layer 21, which is not so difficult. Thirdly, according to the method of this embodiment, anode formation is conducted after the completion of the passivation process. Accordingly, the etching resist 23 can be formed under the condition that the cavity 26 has not been formed yet. Therefore, it is easy to form the etching resist 23. In other words, no etching resist 23 enters the cavity 26. Therefore, it is not necessary to conduct the complicated work to remove the etching resist 23. Since alkali etching is conducted after the completion of the passivation process, there is no possibility that the wiring pattern 9 and bonding pad 10 are polluted by the etching resist 23. As described above, according to the method of this embodiment, it is possible to simplify the manufacturing process of the acceleration sensor 1 so that the manufacturing work can be easily carried out.

Further, according to this manufacturing method, the porous silicon layer 25 is removed. Therefore, this manufacturing method is advantageous in that the crystal plane index of the silicon base plate 2 is not particularly restricted. Essentially, the manufacturing method of this embodiment is similar to the manufacturing process of the bipolar IC. Accordingly, the method of this embodiment is advantageous in that the acceleration sensor 1 and the bipolar IC can be integrated into one body, which is advantageous when the acceleration sensor 1 is downsized and the processing speed of the acceleration sensor 1 is increased.

Second Embodiment

With reference to FIGS. 12 to 22, the second embodiment of the present invention will be explained below. In this connection, like reference characters are used to indicate like parts in the first and second embodiments, and the detailed explanations are omitted here.

Figure 12A:
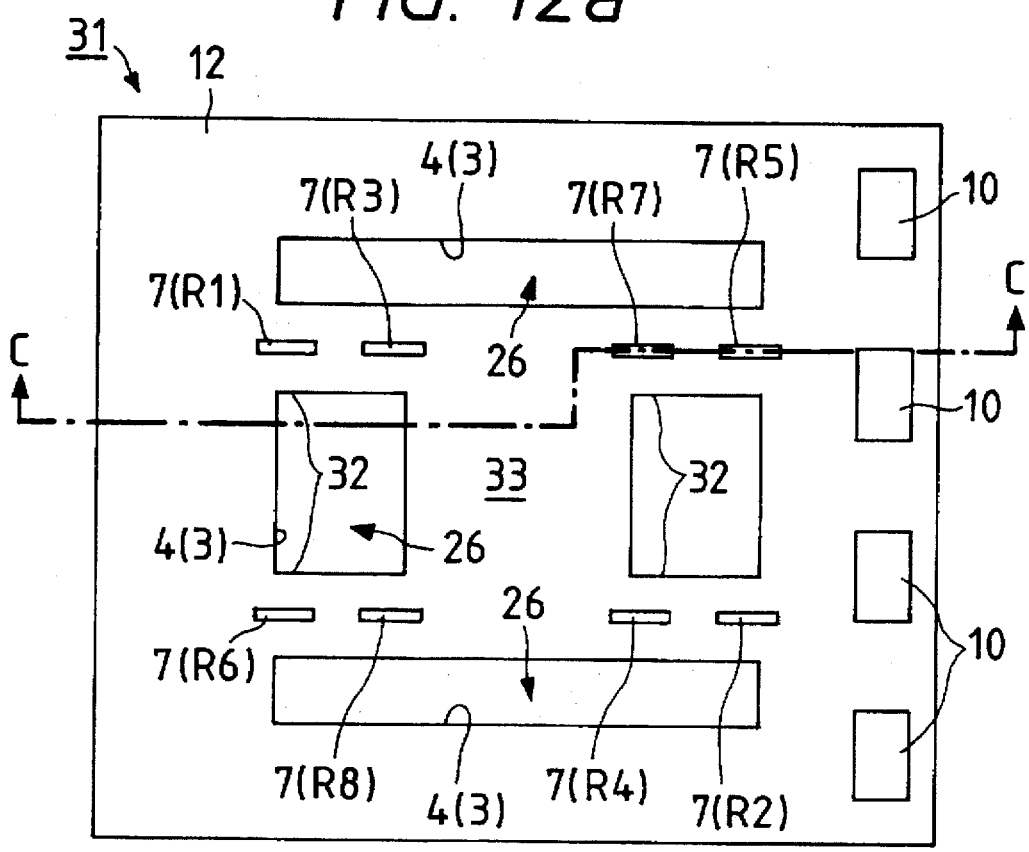
FIG. 12a is a plan view showing an outline of to acceleration sensor of the second embodiment.
Figure 12B:
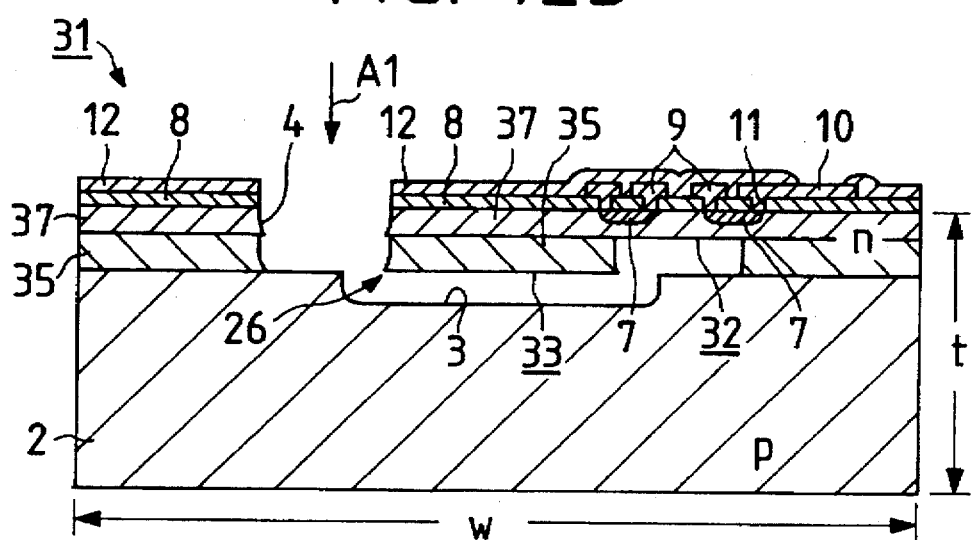

FIGS. 12(a) and 12(b) are overall arrangement views of the surface type acceleration sensor 31 of this embodiment. An approximately square recess portion 3 is formed at the center of the p-type single crystal silicon base plate 2, the crystal plane index of which is (110). The recess portion 3 is provided with 4 rectangular openings 4. In this recess portion 3, there is provided a cantilever structure portion, the type of which is different from that of the first embodiment, so that the cantilever structure portion can be displaced in the upward and downward direction. The cantilever structure portion includes 4 beams 32 and a mass portion 33 supported by these beams 32. Each beam 32 includes the second epitaxial growth layer 37 principally made of n-type single crystal silicon. On an upper face of each beam 32, there is formed a diffusion strain gauge 7 made of p-type silicon by adding impurities. The mass portion 33 functioning as a weight includes the first and second epitaxial growth layers 35, 37 principally made of n-type single crystal silicon.

Dimensions of each portion of this embodiment are described as follows. Width W and thickness t of the silicon base plate 2 including the epitaxial growth layers 35, 37 are respectively 1000 µm and 550 µm. Thickness of the first epitaxial growth layer 35 is approximately 10 µm, and thickness of the second epitaxial growth layer 37 is approximately 10 µm. Other dimensions are the same as those of the first embodiment.

The layout of the diffusion strain gauges 7 (diffusion strain resistances R1 to R8) provided on the beam 32 is schematically illustrated in FIG. 12(a). On an upper face of each beam 32, there are provided 2 diffusion strain resistances. In this case, the diffusion strain resistances R1 to R8 are disposed as follows. R1 and R3, R2 and R4, R5 and R7, and R6 and R8 are respectively disposed on the same beam 32. The longitudinal direction of each diffusion strain resistance R1 to R8 is parallel to the extending direction of each beams that is, the direction of <111>.

Figure 13:
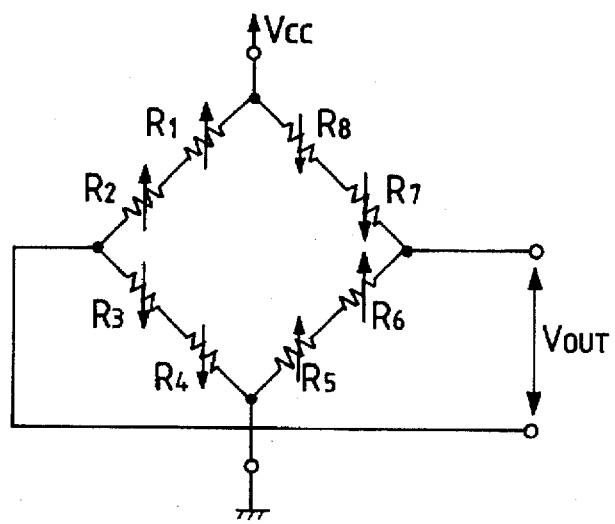
FIG. 13 is an equivalent circuit diagram of the acceleration sensor of the second embodiment.

In FIG. 13, there is shown an equivalent circuit of the diffusion strain resistances R1 to R8. As shown in circuit diagram, R1 and R2, R3 and R4, R5 and R6, and R7 and R8 are respectively connected in series. These 8 diffusion strain resistances R1 to R8 include one bridge circuit. A node formed between the diffusion strain resistances R1 and R8 is connected with a bonding pad 10 for supplying the power source voltage $V_{CC}$. On the other hand, a node formed between the diffusion strain resistances R4 and R5 is connected with a bonding pad 10 for ground. A node formed between the diffusion strain resistances R6 and R7 is connected with one of the 2 bonding pads 10 for outputting. A node formed between the diffusion strain resistances R2 and R3 is connected with the other of the 2 bonding pads 10 for outputting.

When an acceleration is impressed upon this acceleration sensor 31 in the direction of arrow A1 in FIG. 12(b), the mass portion 33 is displaced downward, so that each beam 32 is bent. At this time, strain is induced in the diffusion strain gauges 7 including diffusion strain resistances R1 to R8. As a result, due to the piezo-resistance effect of silicon, the resistance value of each diffusion strain gauge 7 is increased or decreased when a change in this resistance value is detected, the acceleration can be detected.

Next, the manufacturing procedure of the acceleration sensor 31 of this embodiment will be explained with reference to FIGS. 14 to 22. Different points from the first example will be mainly explained here.

Figure 14A:
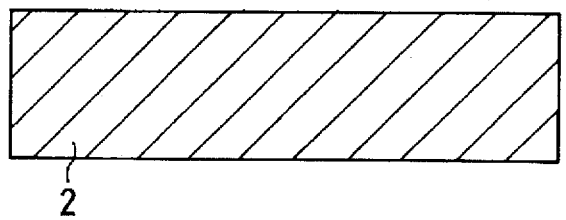
FIG. 14a is a plan view showing an outline of the acceleration sensor of the second embodiment.
Figure 14B:
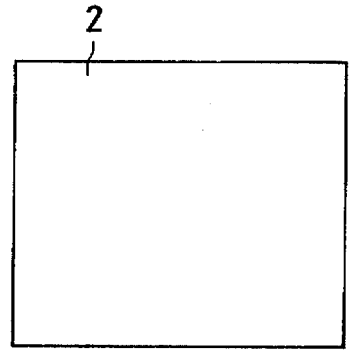
FIG. 14b is a cross-sectional view showing an outline of the acceleration sensor of the second embodiment.
Figure 15A:
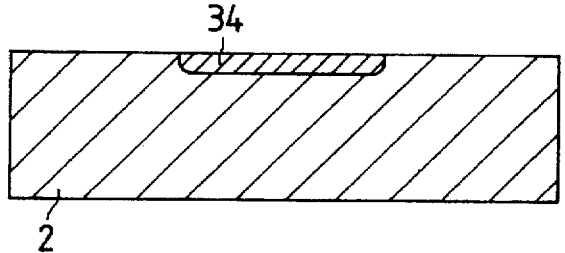
FIG. 15a is a cross-sectional view showing an outline of the acceleration sensor of the second embodiment.
Figure 15B:
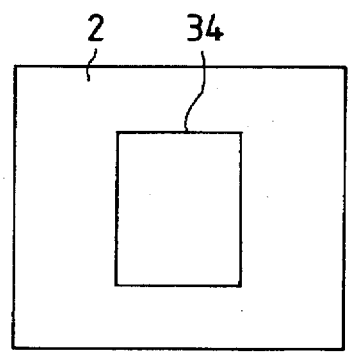
FIG. 15b is a plan view showing an outline of the acceleration sensor of the second embodiment.

First, as illustrated in FIG. 14, a p-type single crystal silicon base plate 2 is prepared, the shape of which is rectangular parallelepipedic, and the crystal plane index of which is (110). A mask not shown in the drawing is formed on the surface of the silicon base plate 2. Next, in the same manner as that of the first example, boron is thermally diffused by adding impurities. As a result, as illustrated in FIG. 15, a first p-type silicon layer 34 is formed approximately at the center of the silicon base plate 2.

Next, as illustrated in FIG. 16, a first epitaxial growth layer 35 made of n-type single crystal silicon is formed on an upper face of the silicon base plate 2, on which the first p-type silicon layer 34 is formed, by gaseous phase growth. As a result, the first p-type silicon layer 34 is embedded in the epitaxial growth layer 35. After that, a mask not shown is formed on the surface of the silicon base plate 2 on which the epitaxial growth layer 35 has been formed. An approximately C-shaped opening is formed in a predetermined region of the mask by photo-etching. Next, when impurity diffusion of boron is conducted on the silicon base plate 2, an approximately O-shaped second p-type silicon layer 36 is formed as illustrated in FIG. 17.

Next, as illustrated in FIG. 18, a second epitaxial growth layer 37 made of n-type single crystal silicon is formed on an upper face of the silicon base plate 2, on which the second p-type silicon layer 36 is formed, by gaseous phase growth. As a result, the second p-type silicon layer 36 is embedded in the epitaxial growth layer 37. After that, a mask not shown is formed on the surface of the silicon base plate 2 on which the epitaxial growth layer 37 has been formed. Further, 4 openings are formed in a predetermined region on the mask by photo-etching. Next, when the impurity diffusion of boron is conducted on the silicon base plate 2, the p-type silicon layer 22 for forming the opening is formed at 4 portions as illustrated in FIG. 19. Depth of this p-type silicon layer 22 reaches the embedded second p-type silicon layer 36.

Figure 22:
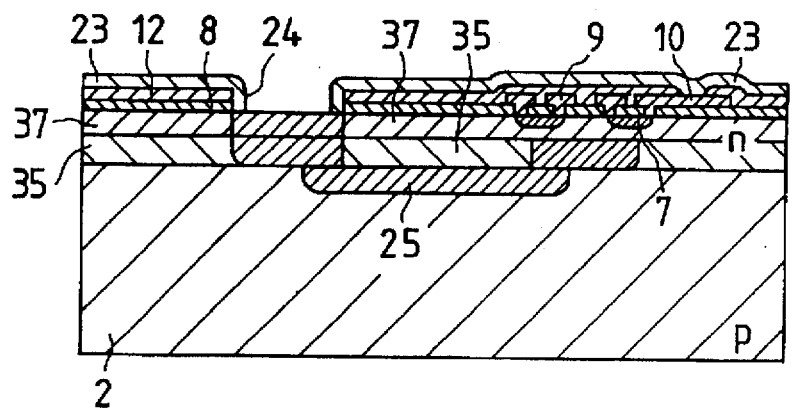
FIG. 22 is a cross-sectional view showing an outline of the acceleration sensor of the second embodiment.
Figure 23:
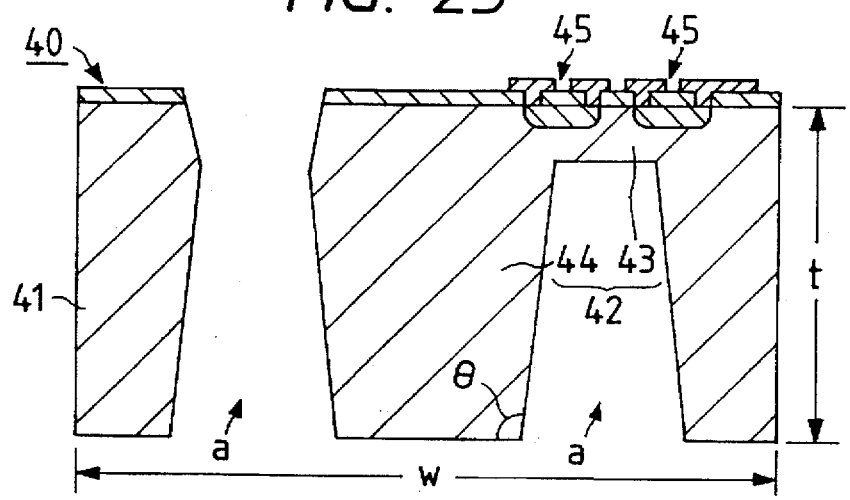
FIG. 23 is a cross-sectional view showing an outline of the conventional bulk type acceleration sensor.
Figure 24:
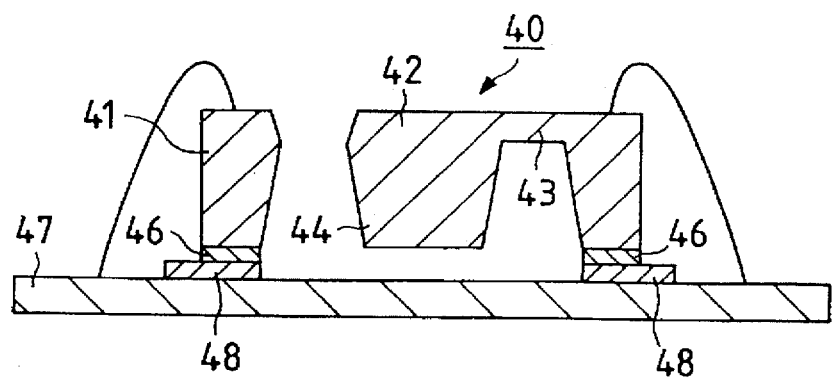
FIG. 24 is a cross-sectional view showing an outline of the condition in which the conventional bulk type acceleration sensor is packaged.

Manufacturing processes conducted after that (such as a formation process to form the diffusion strain gauge 7 and the oxide film 8, a wiring and passivation process, a formation process to form the etching resist 23, a process of anode formation and a process of alkali etching) are conducted in the same manner as that of the first example as illustrated in FIGS. 20 and 22. Finally, the unnecessary etching resist 23 is removed. In this way, the acceleration sensor 31 shown in FIG. 12 is provided.

It is clear that the acceleration sensor 31 of this embodiment provides the same mode of operation as that of the first embodiment described before. In addition to that, according to this manufacturing method, there are provided 2 epitaxial layers 35, 37. Therefore, it is relatively easy to form even a complicated cavity 26. Accordingly, the manufacturing method of this embodiment is convenient when the cantilever structure portion having the mass portion 33 is formed as shown in FIG. 12. Due to the foregoing, it is possible to accomplish the detection sensitivity corresponding to the detection sensitivity of the bulk type acceleration sensor by this embodiment. In this connection, the thickness of the mass portion 33 and the thickness of the beam 32 can be relatively easily controlled by setting the thickness of the first epitaxial growth layer 35 and the thickness of the second epitaxial growth layer 37.

It is possible to change the present invention as follows.

(1) Base plates except for, the base plate, the crystal plane index of which is (110), may be used for the p-type single crystal silicon base plate 2, for example, base plates, the crystal plane index of which is (111) or (100), may be used for the p-type single crystal silicon base plate 2. In this connection, when the base plate, the crystal plane index of which is (100) is used in the first embodiment, the detection sensitivity can be more enhanced.

(2) As an alkaline etching agent except for TMAH, for example, KOH, hydrazine and EPW (ethylenediamine-pyrocatechol-water) may be used.

(3) As a metallic material for forming the wiring pattern 9 and the bonding pad 10, not only Al but also Au may be selected.

(4) In the second embodiment, the number, shape and layout of the beams 32 may be different from those of the embodiment. That is, the number of the beams 32 may be not more than 3 or not less than 5. The beams 32 may be disposed at the corners of the mass portion 33.

(5) In the cases of manufacture of the acceleration sensors 1 and 31, instead of the epitaxial growth layers 6, 35, 37, for example, the n-type multi-crystal silicon layer and the amorphous silicon layer may be used.

(6) in the first and second embodiments, instead of the exemplary diffusion type strain gauge 7, for example, a thin film gauge made of Cr or multi-crystal silicon may be formed.

(7) In the first example, the mass portion 33 may be formed on the lower side of the end portion of the cantilever 5. In the second embodiment, the mass portion 33 may be omitted.

(8) A bipolar IC functioning as a signal logical circuit may be formed in a space of the periphery of the cantilever structure portion on the surface of the silicon base plate 2.

Not only the technical concept described in the present invention but also the technical concept obtained from the above embodiments and other embodiments will be described below together with the effects.

A bipolar IC is formed is the periphery of the cantilever structure portion. According to this structure, the acceleration sensor can be downsized and the processing speed can be increased.

In this connection, the technical terms used in this specification are defined as follows.

"The cantilever structure portion" is defined as a portion which is displaced when an acceleration is impressed. For example, the cantilever structure portion" is defined as a portion including in such a manner that a mass portion is supported by one beam or not less than 2 beams or defined as a portion including only a cantilever having no mass portion.

"Anode formation" is defined as a package quality improvement processing by which a porous layer is formed on a base plate when an electric current is caused to flow on the base plate disposed in an electrolyte under the condition that the base plate is used as an anode.

The following effects can be provided by the present invention. According to the invention, it is possible to provide a compact surface type acceleration sensor, the detection sensitivity of which is high, and the sensor can be easily packaged. Especially, according to the invention, the acceleration sensor can be further downsized. Especially, according to the invention, the detection sensitivity of the acceleration sensor can be further enhanced.

According to the invention, the manufacturing process can be simplified and the manufacturing work can be easily carried out When the aforementioned excellent surface type acceleration sensor is manufactured. Especially according to the invention, the cantilever structure portion having the mass portion can be relatively easily formed.

What is claimed is:

1. A method of manufacturing a surface type acceleration sensor, said method comprising the steps of:

forming a p-type silicon layer in a region on the front face side of the p-type single crystal silicon base plate by adding impurities;

embedding the p-type silicon layer in an epitaxial growth layer when the epitaxial growth layer made of n-type single crystal silicon is formed on an upper face of the p-type single crystal silicon base plate;

forming a p-type silicon layer for the formation of an opening portion on the epitaxial growth layer by adding impurities;

forming a strain gauge made of p-type silicon on an upper face of the epitaxial growth layer;

forming a passivation film for covering a wiring pattern after the formation of the wiring pattern connected to the strain gauge;

changing each p-type silicon layer into a porous silicon layer when anode formation processing is conducted under the condition that an etching resist is formed on an upper face of the passivation film; and forming a cavity in a portion where the porous silicon layer is located when the porous silicon layer is removed by alkali etching.

2. A method of manufacturing a surface type acceleration sensor, said method comprising the steps of:

forming a first p-type silicon layer in region on the front face side of the p-type single crystal silicon base plate by adding impurities;

embedding the first p-type silicon layer in a first epitaxial growth layer when the first epitaxial growth layer made of n-type single crystal silicon is formed on an upper face of the p-type single crystal silicon base plate;

forming a second p-type silicon layer in a region on the first epitaxial growth layer by adding impurities;

embedding the second p-type silicon layer in a second epitaxial growth layer when the second epitaxial growth layer made of n-type single crystal silicon is formed on an upper face of the first epitaxial growth layer;

forming partially a p-type silicon layer for the formation of an opening portion on an upper face of the embedded second p-type silicon layer when impurities are added;

forming a strain gauge made of p-type silicon on an upper face of the epitaxial growth layer;

forming a passivation film for covering a wiring pattern after the formation of the wiring pattern connected to the strain gauge;

changing each p-type silicon layer into a porous silicon layer when anode formation processing is conducted under the condition that an etching resist is formed on an upper face of the passivation film; and forming a cavity in a portion where the porous silicon layer is located when the porous silicon layer is removed by alkali etching.

* * * * *

UNITED STATES PATENT AND TRADEMARK OFFICE
CERTIFICATE OF CORRECTION

PATENT NO. : 5,665,250
DATED : September 09, 1997
INVENTOR(S) : Hitoshi IWATA et al.

It is certified that error appears in the above-indentified patent and that said Letters Patent is hereby corrected as shown below:

On the title page, item [54],
and column 1, lines 2-3, in the title, lines 2-3, after "SENSOR" delete "METHOD OF MANUFACTURING".

Claim 2, column 12, line 35, after "layer in", insert --a--.

Signed and Sealed this

Twenty-seventh Day of January, 1998

Attest:

BRUCE LEHMAN

Attesting Officer

Commissioner of Patents and Trademarks